United States Patent
DiStefano et al.

(10) Patent No.: US 6,365,975 B1
(45) Date of Patent: Apr. 2, 2002

(54) CHIP WITH INTERNAL SIGNAL ROUTING IN EXTERNAL ELEMENT

(75) Inventors: Thomas H. DiStefano, Monte Sereno; John W. Smith, Palo Alto, both of CA (US)

(73) Assignee: Tessera, Inc., San Jose, CA (US)

( * ) Notice: Subject to any disclaimer, the term of this patent is extended or adjusted under 35 U.S.C. 154(b) by 0 days.

(21) Appl. No.: 09/053,816

(22) Filed: Apr. 2, 1998

Related U.S. Application Data

(63) Continuation-in-part of application No. 09/020,754, filed on Feb. 9, 1998
(60) Provisional application No. 60/063,954, filed on Oct. 31, 1997, and provisional application No. 60/042,187, filed on Apr. 2, 1997.

(51) Int. Cl.[7] .......................... H01L 21/60; H01L 23/58; H01L 23/48; H05K 1/11
(52) U.S. Cl. ...................... 257/777; 257/700; 257/723; 257/738; 257/737; 257/778; 257/686; 257/685; 361/769; 361/767; 361/790; 361/735; 361/729; 324/755; 324/765
(58) Field of Search ................................ 257/666, 678, 257/696, 698, 690, 669 M, 778, 738, 737, 777, 723, 728, 686, 685, 665, 48; 361/769, 735, 767, 729, 790, 765, 768, 792; 324/755, 765

(56) References Cited

U.S. PATENT DOCUMENTS

| | | |
|---|---|---|
| 3,643,138 A | 2/1972 | Kilby |
| 4,021,838 A | 5/1977 | Warwick |
| 4,441,119 A | 4/1984 | Link ........................... 357/74 |
| 4,498,122 A | 2/1985 | Rainal ........................ 361/414 |
| 4,595,945 A | 6/1986 | Graver |
| 4,628,411 A | 12/1986 | Balderes et al. ............ 361/414 |

(List continued on next page.)

FOREIGN PATENT DOCUMENTS

| | | |
|---|---|---|
| EP | 0421343 A2 | 4/1991 |
| EP | 0489177 A1 | 6/1992 |
| JP | 1-132150 | 5/1989 |
| WO | WO/94/03036 | 2/1994 |
| WO | WO 96/02068 | 1/1996 |
| WO | WO 97/11486 | 3/1997 |
| WO | WO 97/40958 | 11/1997 |

OTHER PUBLICATIONS

*Thin Film Module*; 700 IBM Technical Disclosure Bulletin, Jan. 31, 1989, No. 8, Armonk, NY, US; pp. 135–138.

Electrical Design of Digital Multichip Modules, by Paul D. Franzon, Chapter 11 in the treatise Multichip Module Technologies and Alternatives—The Basics, Doane and Franzon, eds. 1993, pp. 525–568.

*Primary Examiner*—Alexander O. Williams
(74) *Attorney, Agent, or Firm*—Lerner, David, Littenberg, Krumholz & Mentlik, LLP

(57) ABSTRACT

A semiconductor chip is provided with a dielectric element having conductive features interconnecting electronic elements within the chip with one another. The conductive features replace internal conductors, and can provide enhanced signal propagation between elements of the chip. The conductive features on the dielectric element are connected to contacts on the chip by deformable conductive elements such as flexible leads so that the dielectric element remains movable with respect to the chip. The dielectric element may have a coefficient of expansion different from that of the chip itself.

27 Claims, 8 Drawing Sheets

U.S. PATENT DOCUMENTS

| | | | | |
|---|---|---|---|---|
| 4,695,870 | A | 9/1987 | Patraw | 361/380 |
| 4,696,525 | A | 9/1987 | Coller et al. | 439/69 |
| 4,716,049 | A | 12/1987 | Patraw | 427/96 |
| 4,866,507 | A | 9/1989 | Jacobs et al. | 361/397 |
| 4,902,606 | A | 2/1990 | Patraw | 430/314 |
| 4,924,353 | A | 5/1990 | Patraw | 361/400 |
| 5,055,907 | A | 10/1991 | Jacobs | |
| 5,148,265 | A | 9/1992 | Khandros et al. | |
| 5,148,266 | A | 9/1992 | Khandros et al. | |
| 5,192,716 | A | 3/1993 | Jacobs | |
| 5,212,403 | A | 5/1993 | Nakanishi et al. | 257/700 |
| 5,214,845 | A | 6/1993 | King et al. | 29/841 |
| 5,224,022 | A | 6/1993 | Weigler et al. | 361/409 |
| 5,239,448 | A | 8/1993 | Perkins et al. | 361/764 |
| 5,258,648 | A | 11/1993 | Lin | 257/778 |
| 5,264,729 | A | 11/1993 | Rostoker et al. | 257/774 |
| 5,281,151 | A | 1/1994 | Arima et al. | |
| 5,354,955 | A | 10/1994 | Gregor et al. | 174/250 |
| 5,371,654 | A | 12/1994 | Beaman et al. | 361/774 |
| 5,382,827 | A | 1/1995 | Wang et al. | |
| 5,390,844 | A | 2/1995 | DiStefano et al. | 228/180.21 |
| 5,394,009 | A | 2/1995 | Loo | 257/666 |
| 5,396,034 | A | 3/1995 | Fujita et al. | 174/261 |
| 5,398,863 | A | 3/1995 | Grube et al. | 228/106 |
| 5,455,390 | A | 10/1995 | DiStefano et al. | |
| 5,466,892 | A | 11/1995 | Howard et al. | 174/261 |
| 5,476,818 | A * | 12/1995 | Yahof et al. | |
| 5,483,421 | A | 1/1996 | Gedney et al. | 361/771 |
| 5,489,749 | A | 2/1996 | DiStefano et al. | 174/261 |
| 5,491,302 | A | 2/1996 | DiStefano et al. | 361/772 |
| 5,510,758 | A | 4/1996 | Fujita et al. | 257/778 |
| 5,518,964 | A | 5/1996 | DiStefano et al. | |
| 5,519,176 | A | 5/1996 | Goodman et al. | 174/255 |
| 5,523,622 | A | 6/1996 | Harada et al. | |
| 5,536,909 | A | 7/1996 | DiStefano et al. | 361/767 |
| 5,629,559 | A | 5/1997 | Miyahara | 257/666 |
| 5,635,767 | A | 6/1997 | Wenzel et al. | 257/778 |
| 5,640,048 | A | 6/1997 | Selna | |
| 5,650,918 | A | 7/1997 | Suzuki | 361/760 |
| 5,654,590 | A | 8/1997 | Kuramochi | 257/778 |
| 5,659,201 | A | 8/1997 | Wollesen | 257/758 |
| 5,682,061 | A | 10/1997 | Khandros et al. | 257/666 |
| 5,688,716 | A | 11/1997 | DiStefano et al. | |
| 5,704,593 | A | 1/1998 | Honda | 256/673 |
| 5,714,801 | A | 2/1998 | Yano et al. | 257/691 |
| 5,717,229 | A | 2/1998 | Zhu | 257/776 |
| 5,783,870 | A * | 7/1998 | Mostafazadeh et al. | 257/791 |
| 5,798,286 | A | 8/1998 | Faraci et al. | 438/115 |
| 5,798,571 | A | 8/1998 | Nakajima | |
| 5,830,782 | A | 11/1998 | Smith et al. | 438/123 |
| 5,841,198 | A * | 11/1998 | Chia et al. | 257/780 |
| 5,874,780 | A * | 2/1999 | Murakami | 257/775 |
| 5,940,278 | A * | 8/1999 | Schumacher | 361/769 |
| 5,959,362 | A * | 9/1999 | Yoshino | 257/778 |
| 5,977,640 | A * | 11/1999 | Bertin et al. | 257/777 |
| 5,998,875 | A * | 12/1999 | Bodo et al. | 257/778 |
| 6,011,312 | A * | 1/2000 | Nakazawa et al. | 257/778 |
| 6,075,712 | A * | 6/2000 | McMahon | 257/698 |
| 6,104,082 | A * | 8/2000 | Berlin et al. | 257/665 |

* cited by examiner

CHIP WITH INTERNAL SIGNAL ROUTING IN EXTERNAL ELEMENT

CROSS REFERENCE TO RELATED APPLICATIONS

The present application claims benefit of U.S. Provisional Patent Application Ser. No. 60/042,187, filed Apr. 2, 1997 and Ser. No. 60/063,954, filed Oct. 31, 1997. The present application is also a continuation-in-part of U.S. patent application Ser. No. 09/020,754, filed Feb. 9, 1998. The disclosures of all of said applications are incorporated by reference herein.

BACKGROUND OF THE INVENTION

Semiconductor chips commonly incorporate myriad electronic elements such as transistors, capacitors, resistors and the like, together with more complex electronic elements such as logic gates, amplifiers, comparators, and many other passive and active electrical components. These elements typically are provided in one or more layers extending parallel to the front and back surfaces of the chip. The various electronic elements of the chip typically are interconnected with one another by metallic traces extending within the chip in the horizontal or "X" and "Y" directions and metallic vias extending in the vertical or "Z" direction. Typically, the traces and vias are formed of conductive material deposited during fabrication of the chip as, for example, aluminum or polysilicon. The traces and vias used to interconnect the electronic elements of the chip with one another complicate design and fabrication of the chip.

Moreover, the traces which are fabricated during manufacture of the chip do not always provide optimum electrical characteristics. For example, the traces typically are formed from aluminum, which has a relatively high resistivity. Although processes for fabricating traces in a chip from low-resistivity metals such as copper are known, these processes impose special requirements in chip fabrication. Further, even if a low-resistivity metal is employed, the size and hence the cross-sectional area of traces which can be accommodated within a chip are subject to severe limitations. Traces extending within a chip often follow indirect routes because other elements of the chip lie in a direct route between the electronic elements connected by the trace.

Additionally, chips must be connected to external circuit elements. In the conventional approach to chip packaging, each chip is incorporated in a separate package bearing leads or other external connecting elements. Contacts on the surface of the chip are connected to these external connecting elements. The external connecting elements on the package are connected to a conventional circuit board or other circuit-bearing substrate. Alternatively, several chips may be mounted in a single package, commonly referred to as a "multichip module." These chips may be connected to one another and to a common set of external connecting elements, so that the entire assembly can be mounted to the substrate as a unit. In yet another alternative, the chip itself is attached directly to the substrate.

As described in Arima et al., U.S. Pat. No. 5,281,151, a package in the form of a rigid ceramic board may be provided with a set of "thin film" circuit layers overlying the ceramic board. The thin film layers include metallic traces on a material such as polyimide which has a relatively low dielectric constant. A chip is mounted to the thin film layers by solder balls in engagement with contacts on the chip. A signal can be routed from point to point within the chip along a signal path through a solder ball at one location on the chip, along a metallic trace of the thin film element and back into the chip through a solder ball at another location on the chip. The thin film layer assertedly provides low resistance and relatively rapid signal transmission between elements of the chip.

As described in commonly assigned U.S. Pat. Nos. 5,148,265; 5,148,266; 5,455,390, 5,518,964 and the corresponding WO 96/02068 published Jan. 25, 1996, as well as in co-pending, commonly assigned U.S. patent application Ser. No. 08/653,016, filed May 24, 1996, now U.S. Pat. No. 5,688,716; Ser. No. 08/678,808 filed Jul. 12, 1996 as well as Ser. No. 08/532,528 filed Sep. 22, 1995, and the corresponding International Publication No. WO 97/11486 published Mar. 27, 1997, the disclosures of which are all incorporated by reference herein, it is desirable to provide interconnections between the contacts on a chip and external circuitry by providing a further dielectric element, which may be referred to as a "interposer" or "chip carrier" having terminals. Terminals on the dielectric element are connected to the contacts on the chip by flexible leads. The terminals on the dielectric element may be connected to the substrate as, for example, by solder bonding the terminals to contact pads of the substrate. The dielectric element remains movable with respect to the chip so as to compensate for thermal expansion and contraction of the components. That is, various parts of the chip can move with respect to the dielectric element as the chip grows and shrinks during changes in temperature. In a particularly preferred arrangement, a compliant dielectric layer is provided as a separate component so that the compliant layer lies between the chip and the terminals. The compliant layer may be formed from a soft material such as a gel, elastomer, foam or the like. The compliant layer mechanically decouples the dielectric element and terminals from the chip and facilitates movement of the dielectric element relative to the chip. The compliant layer may also permit movement of the terminals in the Z direction, towards the chip, which further facilitates testing and mounting of the assembly.

As disclosed in copending, commonly assigned U.S. patent application Ser. No. 08/641,698, and International Publication No. WO 97/40958 the disclosure of which is also incorporated by reference herein, the electrically conductive parts on the dielectric element may be connected to the chip by masses of a fusible, electrically conductive material which is adapted to melt at temperatures encountered during processing or operation of the assembly. These masses may be constrained by a surrounding compliant dielectric material so that they remain coherent while in a molten state. The molten masses provide another form of deformable conductive element, which allows movement of the flexible dielectric element relative to chip. As further disclosed in commonly assigned patents and patent applications, one or more chips may be mounted to a common dielectric element or interposer, and additional circuit elements also may be connected to such a dielectric element. The dielectric element may incorporate conductive traces which form interconnections between the various chips and electronic components of the assembly.

Designers of multichip modules have provided connections between different chips as transmission lines including plural conductors. As discussed in Multichip Module Technologies and Alternatives-The Basics, Doane and Franzon, eds., Chapter 11, pp. 525–568, Electrical Design of Multichip Modules (1993), a signal line extending between a pair of digital elements on different chips of a module may extend over a reference plane, such as a ground or power plane, so that the signal line, reference plane and intervening dielectric constitute a controlled-impedance transmission line.

Despite all of these efforts in the art, however, there are significant needs for improvements in semiconductor chips and assemblies incorporating the same. In particular, there are needs for improved chip assemblies which can provide rapid and reliable propagation of signals between electrical elements within a single chip.

SUMMARY OF THE INVENTION

The present invention addresses these needs.

A microelectronic assembly in accordance with one aspect of the present invention incorporates a first semiconductor chip including a plurality of electronic elements adapted to receive and send signals. The electronic elements of the chip may include any of the electronic components mentioned above and any other types which may incorporated in a chip. The chip includes a front surface having contacts thereon. At least some of the electronic elements are connected to the contacts. The assembly further includes a dielectric element separate from the chip. The dielectric element has a plurality of conductive interconnect traces on it.

Most preferably, the dielectric element is movable with respect to the chip. In this case, the assembly includes a plurality of deformable conductive elements such as fusible masses which are at least partially liquid at the operating temperature of the chip or, preferably, flexible leads extending between the chip and the dielectric element. The deformable conductive elements interconnect at least some of the contacts on the chip with at least some of the traces so that at least some of the active electronic elements in the first semiconductor chip are connected to one another for transmission of signals therebetween through the deformable conductive elements and the interconnect traces on the dielectric element. Preferably, a compliant material is provided between the chip and the dielectric element to provide mechanical decoupling between the chip and the dielectric element.

In the preferred assemblies according to this aspect of the invention, signals travel between electronic elements of a single chip through the traces on a separate dielectric element which remains movable with respect to the chip. The dielectric element can have a coefficient of thermal expansion different from that of the chip. The deformable conductive elements will compensate for movement of the traces relative to the contacts on the chip. The ability to use a dielectric element having a coefficient of expansion different from that of the chip allows the designer to use dielectric layers such as polyimide layers with substantial copper features. Structures of this type have electrical properties such as high conductivity and relatively low dielectric constant, but have thermal expansion properties close to those of copper and significantly different from those of the chip.

The dielectric element may be a flat element such as a platelike or sheetlike element having a bottom surface and a top surface opposite from the bottom surface. Most preferably, the dielectric element includes a flexible polymeric sheet or a laminate including plural sheets, having one or more layers of interconnect traces thereon. Where the dielectric element is a flat plate or sheet, the interconnect traces generally will extend in horizontal directions, parallel to the top and bottom surfaces of the dielectric element.

According to a further aspect of the invention, a semiconductor chip assembly includes a first semiconductor chip as aforesaid and a dielectric element separate from the chip. The dielectric element has a plurality of conductive features thereon. At least some of said contacts are connected with at least some of the conductive features so that at least some of the electronic elements of the chip are connected to one another by the conductive features. The conductive features on the dielectric element include at least one set of plural conductive features defining a multiconductor transmission line extending between spaced-apart locations on the dielectric element. The electronic elements of the chip include at least one pair of multiply-connected elements, each said pair of multiply-connected elements is connected to one another through the plural conductive features of one said transmission line.

For example, the conductive features of the dielectric element may include interconnect traces as aforesaid and conductive potential reference elements such as substantially continuous electrically-conductive potential planes. The interconnect traces may be arranged in layers so that some or all of the trace layers are juxtaposed with potential planes. Thus, the traces in these layers are juxtaposed with the potential planes so that each trace and the adjacent potential plane forms a transmission line of the type commonly referred to as a stripline. In such an arrangement, one potential plane may serve as a part of several transmission lines. Alternatively or additionally, the conductive features on the dielectric element may include sets of traces extending adjacent one another, such as two or three traces extending alongside one another. The traces of each such set may define a single multiconductor transmission line. The transmission line configurations discussed above minimize crosstalk between different signals and reduce susceptibility to electromagnetic interference. Further, the transmission lines preferably provide controlled impedance along the length of the transmission line. Most preferably, the characteristic impedance of the transmission line does not change abruptly at any point along the length of the transmission line. Assemblies according to this aspect of the invention provide rapid propagation of signals between widely separated elements on the chip. The most preferred assemblies take advantage of both aspects of the invention, and hence include multiconductor transmission lines on a dielectric element which is connected to the chip through deformable conductive elements and movable with respect to the chip.

At least some ends of the transmission lines, the conductive features of the transmission line are connected to a multiply-connected element of the chip through a plurality of adjacent contacts on said chip. Ends where such connections are provided are referred to herein as "adjacentconnected" ends of the transmission lines. The deformable conductive elements may include flexible leads connecting the conductive features of each transmission line to the contacts on the chip at each such adjacent-connected end. The flexible leads at each adjacent-connected end may include plural separate flexible leads extending next to one another. The leads may be physically parallel to one another. Most preferably, the leads are curved in horizontal directions parallel to the surface of the chip, and the curved leads are nested within one another. The parallel leads provide an extension of the multiconductor transmission line. The parallel leads desirably provide a characteristic impedance close to the characteristic impedance of the transmission line itself.

Alternatively, the flexible leads at least some of said adjacent-connected ends may include a plural-conductor flexible lead incorporating a plurality of conductors extending next to one another and a dielectric between such conductors. Typically, a single plural-conductor lead provides the sole connection of the stripline to the contacts at an end of the transmission line. Here again, the plural-conductor lead can be impedance-matched to the transmission line.

Typically, the electronic elements of the chip are arranged to send and receive digital signals in synchronism with a common clock, such as the internal clock of the chip itself. As discussed below, the transmission lines provide rapid signal transmission between the elements and thus allow operation of the chip at a high clock speed. The transmission lines on the dielectric element may distribute the clock signal itself The transmission lines may be provided in a branching pattern with characteristic impedances selected to suppress signal reflections at the branching points.

The dielectric element may be provided with terminals for connection to an external circuit or substrate. For example, the dielectric element desirably overlies the front surface of the chip, so that a bottom surface of the dielectric element faces towards the front or contact-bearing surface of the chip. A compliant layer desirably is disposed between the dielectric element and the chip. Terminals on the dielectric element may be accessible at the top surface of the dielectric element, facing away from the chip. Thus, the terminals may project from the top surface or may be recessed within holes or vias extending into the dielectric element from the top surface. Some or all of the terminals on the dielectric element may be connected to the first chip through the deformable conductive elements, so that the first chip can be connected to an external substrate by connecting the terminals to contact pads on the substrate. In this instance, the dielectric element and deformable conductive elements serve as part of the package for the chip. The assembly may further include a second semiconductor chip having electronic elements therein. The second semiconductor chip also may be juxtaposed with the dielectric element and may be connected to at least some of the traces on the dielectric element. Thus, the traces on the dielectric element may also form interconnections between the first and second chips so as to provide a multichip module. The assembly may further include one or more auxiliary circuit elements such as capacitors or other discrete components juxtaposed with the dielectric element and connected to at least some of the traces. The traces connect the chip or chips to the auxiliary circuit element as well.

Still further aspects of the present invention provide methods of making semiconductor assemblies. Methods according to this aspect of the invention preferably include the step providing a unitary semiconductor structure having a front surface. The semiconductor structure may be a chip or wafer incorporating a plurality of electronic elements within said structure and contacts on the front surface. The electronic elements have signal connections and are adapted to send and receive time-varying signals through these connections. Preferably, the electronic elements also have constant-potential connections such as ground and/or power connections. At least some of the signal connections are connected to the contacts. The method according to this aspect of the invention further includes the step of assembling a dielectric structure having electrically conductive features thereon to said semiconductor structure so as to connect the electrically conductive features with said contacts through deformable conductive elements. The assembling step is performed in such a manner that that signal connections of at least some of the electronic elements within said unitary semiconductor structure are connected to one another through the contacts, the deformable conductive elements and the conductive features on said dielectric structure. The assembling step is also performed in such a manner that the dielectric structure remains movable with respect to said semiconductor structure.

The unitary semiconductor structure may include a plurality of chips. In this case, the assembling step desirably is performed so that electronic elements within each said chip are connected to one another through conductive features within a portion of the dielectric structure associated with that chip. The method may further include the step of severing the unitary semiconductor structure to separate each said chip from the unitary semiconductor structure so that the portion of the dielectric structure associated with such chip remains with the chip.

Methods according to this aspect of the invention can be used to fabricate assemblies as discussed above.

DETAILED DESCRIPTION OF THE PREFERRED EMBODIMENTS

Figure 1:
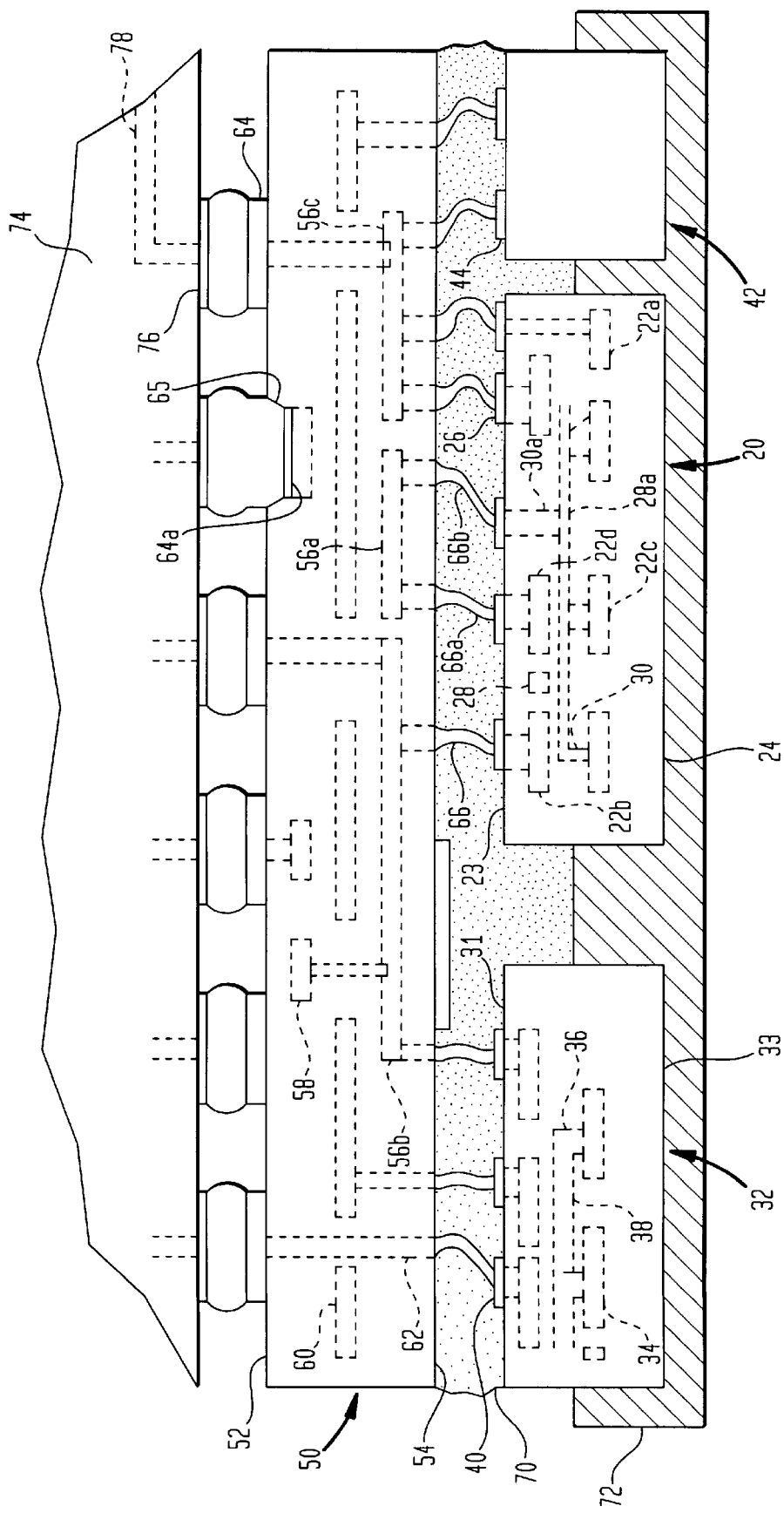
FIG. 1 is a diagrammatic sectional elevation view depicting an assembly in accordance with one embodiment of the invention.

The assembly includes a first semiconductor chip 20 having a front surface 23, a rear surface 24 and a plurality of contacts 26 on the front surface. Chip 20 includes numerous internal electronic elements 22, of which only a few are depicted in FIG. 1. In actual practice, typical chips include hundreds of thousands or millions of such electronic elements. Electronic elements 22 may include conventional analog elements, digital elements or both. Most commonly, the electronic elements are conventional digital circuit elements such as logic gates, flip-flops, and registers. These may be clock-timed elements arranged to send and receive digital signals in synchronism with clock common to all of these elements as discussed below. The clock may be one of the electronic elements of the chip.

Electronic elements 22 are disposed in numerous layers, of which only two are depicted in FIG. 1, i.e., a bottom layer closer to bottom surface 24 and a top layer closer to front surface 23. The bottom layer includes element 22A, whereas the top layer includes element 22B. The chip further includes internal conductive traces 28 extending in horizontal (X and Y) directions parallel to the front and back surfaces 23 and 24 of the chip as well as electrically conductive vias 30 extending in the vertical or Z direction, generally perpendicular to the front and back surfaces of the chip. Here again, only a few of the traces and vias are shown. Traces 28 and vias 30 electrically interconnect some of electronic elements 22 with one another. However, the traces and vias within the chip do not provide all of the interconnections between internal elements of the chip required for the chip to function. For example, electronic element 22D must be connected to element 22C for functioning of the chip, but no internal interconnection is provided. Stated another way, chip 20 omits some or all of the internal interconnections which would normally be provided in a chip of comparable design incorporating the same electrical elements. At least some of the electrical elements 22 are connected to contacts 26 on the front surface of the chip by some of the vias and traces within the chip. The assembly further includes a second semiconductor chip 32 which includes electronic elements 34, vias 36, traces 38 and terminals 40 similar to the corresponding elements of first chip 20. Chip 32 has a front surface 31 and a rear surface 33. One or more auxiliary electrical components such as capacitor 42 are also provided. Capacitor 42 has terminals 44 electrically connected to its opposing plates (not shown). Other discrete components such as resistors, inductors and active components may be provided in the same manner.

A dielectric element 50 having a top surface 52 and a bottom surface 54 is juxtaposed with chips 20 and 32 and with auxiliary element 42 so that the dielectric element overlies the front surfaces 23 and 31 of the chips. The dielectric element is also juxtaposed with the contact-bearing surface of auxiliary electrical element 42. Dielectric element 50 has numerous traces 56 and 58 extending in horizontal directions generally parallel to the top and bottom surfaces 52 and 54. The dielectric element further includes substantially continuous electrically conductive potential reference plane elements 60. Only a few traces 56 and 58 disposed in two layers are depicted in FIG. 1 and only one potential plane element 60 is shown in FIG. 1. In practice, however, the traces may be disposed in numerous layers and numerous potential plane elements may be provided. The traces and potential plane elements desirably are disposed in an alternating arrangement, so that each layer of traces lies adjacent to a potential plane element. A layer of the dielectric material of element 50 is disposed between each trace and the neighboring potential plane element 60. Further, although the traces are shown extending within the interior of dielectric element 50, some or all of the traces may be disposed on the top or bottom surfaces 52 and 54 of the dielectric element. The design of the dielectric element, including the traces 56 and 58 and potential reference planes, may be selected so that each trace, together with the neighboring potential reference plane and the intervening dielectric, define a transmission line having controlled characteristic impedance and relatively low DC resistivity. The same design rules and considerations commonly employed in design of transmission lines on circuit panels, such as thin-film multilayer interconnect circuits and circuit boards, intended to connect numerous chips or discrete elements with one another, may be employed in design of the transmission lines in dielectric element 50. Examples of the design rules and configurations used for this purpose are set forth in the treatise, Multichip Module Technologies and Alternatives—The Basics, Doane and Franzon, eds., 1993, pp. 259–276 and 525–567, the disclosures of which are hereby incorporated by reference herein.

Dielectric element 50 desirably is formed from a dielectric material having relatively low dielectric constant, desirably below about 4, such as polymeric material. A particularly preferred dielectric material is polyimide which has a dielectric constant of about 3.5, and which also has good dimensional stability. The traces desirably are formed from highly conductive materials such as metals having resistivity less than about 2.5 micro-ohm-cm. Gold, silver and, copper are preferred; copper and copper-based alloys are most preferred. In a multilayer traces 58 and 56 can be formed on each layer by conventional plating, etching or other patternwise forming processes. The traces typically are about 5 $\mu$m thick or more, and have widths of about 10 $\mu$m or more, most typically about 15–40 $\mu$m. Thus, traces 58 and 56 have greater cross-sectional area than the internal conductors commonly used within the chips themselves.

The coefficient of linear thermal expansion of the dielectric element 50 with the metallic traces and potential planes thereon is close to the coefficient of linear thermal expansion of the metallic materials incorporated in the traces and potential planes. Stated another way, the coefficient of thermal expansion is of the dielectric element is controlled principally by the thermal expansion properties of the metallic elements. Thus, the dielectric element typically has a coefficient of thermal expansion substantially greater than the coefficient of thermal expansion of the chip. Unless otherwise specified, the term "coefficient of thermal expansion" as used herein refers to the means coefficient of linear thermal expansion (as opposed to area or volumetric expansion) unless otherwise specified. Also, unless otherwise specified the value of such coefficient is the value at about 20–30° C. Where copper is used as the metal on the dielectric element, the dielectric element typically has a coefficient of thermal expansion greater than $10 \times 10^{-6}/°$ C., and typically about $17 \times 10^{-6}/°$ C. By contrast, silicon chips commonly have a coefficient of thermal expansion of about $2.8 \times 10^{-6}/°$ C.

Dielectric element 50 further includes vias 62, i.e., conductors extending generally in vertical directions perpendicular to top and bottom surfaces 52 and 54. A plurality of terminals 64 are provided. These terminals are accessible at the top surface of the dielectric element so that the terminals can be connected to contact pads 76 of a substrate as further discussed below. As depicted in FIG. 1, most of the terminals 64 project outwardly from the surrounding portions of the top surface 52 of the dielectric element. However, the terminals may also disposed in recessed portions of the top surface, such as in vias. Thus, terminal 64a is recessed relative to the surrounding portions of top surface 52, but remains exposed and accessible at the top surface through via 65.

Some or all of traces 56 and 58 are connected to terminals 26 on first chip 20 by flexible leads 66. Thus, the traces are connected to the electronic elements 22 of chip 20. At least some of the traces are connected to two or more electronic elements arranged to interchange signals with one another. For example, trace 56A and flexible leads 66A and 66B are connected between electronic elements 22C and 22D. Thus, a path for transmission of signals from element 22C and 22D extends from element 22C through internal trace 28A of the chip via 30A of the chip and then out of the chip through lead 66B, trace 56A and trace 66A back to element 22D. In similar fashion, traces 56 and 58 form parts of many additional interconnect paths between electrical elements of chip 20. Some of the traces, such as trace 56B provide connections between the first chip 20 and the second chip 32, whereas still other traces such as trace 56C provide interconnections between electronic elements of 20 and the auxiliary electronic element 42. Vias 62 and some or all of the traces may also interconnect terminals 64 with the electronic elements of the chip and with the auxiliary circuit element or elements 42. The traces, vias and flexible leads also interconnect some of terminals 64 with potential reference planes 60 and also connect some of the contacts on each chip to these reference planes. These connections serve as ground or power connection to the assembly.

The assembly further includes a layer of a compliant material 70 such as a gel, foam, or elastomer, or a thermoplastic or other adhesive having a low modulus of elasticity, disposed between the bottom face 54 of the dielectric element and the chips. The flexible leads 66 extend through compliant layer 70. The assembly may further include a cover or heat sink 72 which may encompass some or all of the other elements of the package. Terminals 64 serve to connect the foregoing elements of the assembly to a substrate such as a circuit board or other external device 74. Thus, each terminal 64 may be connected to a corresponding contact pad 76 on substrate 74 by a mass of solder or other conventional bonding material. Each such contact pad may be connected by internal circuitry 78 of the substrate to other elements of a larger circuit.

The physical structures of the flexible leads and compliant layer may be substantially as disclosed in the aforementioned commonly assigned patents and co-pending applications. As described in said patents and co-pending applications, individual portions of the chip 20 can move relative to the dielectric element without creating large mechanical stresses in the flexible leads. Thus, during operation of the system, thermal expansion and contraction of dielectric element and chip 20 may cause parts of the chip to move relative to the dielectric element 50. Such movement can be accommodated without substantial mechanical stress in the flexible leads or in the dielectric element itself.

Figure 2:
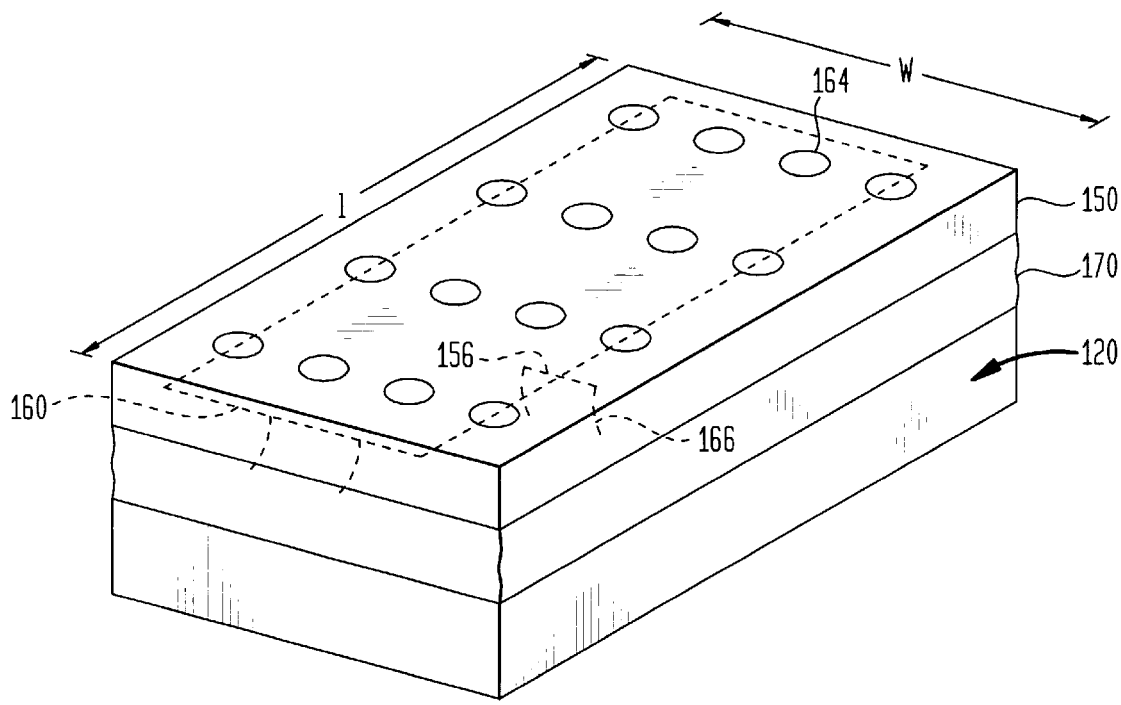
FIG. 2 is a diagrammatic perspective view depicting an assembly in accordance with another embodiment of the invention.

An assembly according to a further embodiment of the invention, depicted in FIG. 2, includes only one chip 120. The dielectric element 150 has length l and width w approximately equal to the corresponding dimensions of chip 120 itself. Dielectric element 150 includes internal potential reference planes 160 and traces 156, of which a few are indicated in FIG. 2, similar to those discussed with reference to FIG. 1. In this embodiment as well, the traces of the dielectric element are connected to contacts on the chip by flexible leads 166 so that the traces and flexible leads interconnect electrical elements of the chip to one another for transmission of signals therebetween. The flexible leads also connect the terminals 164 on the top surface of the dielectric element with the chip 120. The structure of FIG. 2 provides a single unit or "tile" having all of the advantages achieved by interconnecting elements of the chip to one another through the traces of the dielectric element.

Particularly preferred methods of making assemblies with large numbers of flexible leads interconnecting contacts on a chip and conductors on a dielectric element are disclosed in the aforementioned U.S. Pat. No. 5,518,964 and WO 96/02068, as well as in the aforementioned co-pending commonly assigned patent applications. Briefly, in preferred methods according to these patents and applications, each flexible lead has a first or terminal end permanently attached to the dielectric element and a second or tip end releasably attached to the dielectric element. The dielectric element is juxtaposed with the chip and the tip ends of the leads are bonded to the contacts on the chip, whereupon the chip and dielectric element are moved away from one another to release the tip end of each lead from the dielectric element and deform the leads in a controlled manner to a vertically-extensive configuration. The compliant layer may be formed by injecting a flowable material between the chip and the dielectric layer and then curing the flowable material to form the compliant layer. In a variant of this process, the leads are initially provided on the surface of the chip and bonded to contacts on the dielectric elements. These processes may be performed while the chip is present as part of a wafer. The wafer-level process can be used, for example, to make single chip tiles as depicted in FIG. 2. The flexible leads may be configured as disclosed in copending, commonly assigned U.S. Provisional Patent Application Ser. No. 60/026,013, and in U.S. patent application Ser. No. 08/927,601, claiming benefit of such provisional, the disclosures of which are hereby incorporated by reference herein, so as to provide a low-inductance connection between the chip contacts and the conductive traces and vias of the dielectric element. As taught in copending, commonly assigned U.S. patent application Ser. No. 08/715,571, and the corresponding International Publication No. WO 97/11588 published Mar. 27, 1997, and copending, commonly assigned United States Provisional Patent Application Ser. No. 60/057,741, filed Aug. 28, 1997, entitled Connection Component and Methods With Polymer Reinforced Leads, the disclosures of which are hereby incorporated by reference herein, each flexible lead may include both a principal conductor and a reference conductor, and a dielectric material intervening between the principal conductor and the reference conductor, so that the lead itself provides a controlled-impedance transmission line. The principal conductor of each such lead may be electrically continuous with one of the traces 56 or 58, whereas the reference conductor of each such lead may be continuous with one of the potential plane elements 60.

The particular arrangement of interconnections between the various elements depends upon the circuit design of the particular chip or chips. However, the electrical elements of each chip which are interconnected with one another through the traces 56 or 58 of the dielectric element desirably include clock-timed elements arranged to send and receive signals to one another as digital signals through the traces of the interconnect element in synchronism with a common clock such as the internal clock of the chip itself Thus, typical digital electronic chips operate cyclically. An electronic element must react to the signal which it received during the previous clock cycle and send a signal to an associated element so that the receiving element obtains the new signal in usable form before the end of the clock cycle. Thus, the required cycle time for any pair of elements includes the internal operation time of the element which sends the signal, plus the transmission time required for the signal to reach a stable value at the receiving element after the sending element operates. The time for each cycle of the clock cannot be less than the longest required cycle time for any pair of elements controlled by the clock.

As described in the aforementioned Doane and Franzon treatise, the signal transmission time or $t_{interconnect}$ includes both signal propagation time and settling time. Signal propagation time or $t_{prop}$ is the time required for the voltage at the receiving end of the transmission line to rise for the first time after the voltage at the sending end of the transmission line rises. Settling time or $t_{settle}$ is a measure of the time required for voltage oscillations due to reflections and noise in the transmission line to dissipate. The electrical characteristics achievable in the controlled impedance paths provided by the traces of the dielectric elements can provide equal or, preferably, shorter interconnect times than those which are achievable in purely internal circuitry within the chip itself Typically, the dielectric material of the dielectric element 50 has a lower dielectric constant than the dielectric material of the chip itself, which tends to provide a higher signal propagation speed along the paths provided by the traces than along the internal traces 28 of the chip itself. The traces on the dielectric element may have width and thickness optimized to provide short interconnect times. Thus, the dimensions of the internal traces of the chip are constrained both by the limited space available within the chip itself and by the limitations of chip-fabrication processes. Typically, these internal traces within the chip are on the order of one micron or less in width and thickness. The internal traces thus have a high resistance, which tends to lengthen the settling time. Moreover, the space within the chip is occupied by the electronic elements themselves, so that the internal traces often must take tortuous paths which increases the physical length of each trace and thereby increases the propagation time. By contrast, the dielectric element can provide traces of substantially greater width and thickness than the internal traces within the chip, and which therefore have lower resistance. Also, the traces on the dielectric element can follow routings which are close to optimun. Moreover, typical internal traces are formed from highly resistive metals such as aluminum, which further aggravates the problem of high resistance, whereas the traces on the dielectric element are conveniently formed from metals of lower resistivity such as copper or gold. Additionally, almost any number of layers of traces can be provided on the dielectric element.

In many cases it is impossible to provide controlled characteristic impedance along the length of an internal trace within the chip. Thus, in many cases the internal conductors 28 within the chip have marked variations in characteristic impedance along their length. This leads to signal reflections along the leads and increased settling time. The traces 56 and 58 of the dielectric element, in conjunction with the potential reference elements 60 and the dielectric intervening between each trace and the neighboring potential reference elements provide controlled, desirably constant characteristic impedance along the length of each trace. This minimizes signal reflections along the length of the trace and greatly reduces the settling time associated with the interconnection.

Thus, where some or all of the interconnections between electronic elements of the chip are made through the traces of the dielectric element, the clock speed of the chip may be increased above the clock speed which would be possible using only interconnections within the chip itself. It is not necessary to make all of the interconnections between elements of the chip through the traces on the dielectric element in order to achieve such an increase. Typically, in a given chip design, a few interconnections pose the most critical problem. Interconnections between widely separated elements of the chip or interconnection which require difficult, tortuous routings between chip elements may have longer interconnect times than other interconnections within the same chip. Because the clock speed of the entire chip is limited by the longest interconnect time, rerouting of these few critical interconnections through the traces of the dielectric element can allow operation at a higher clock speed. These advantages are particular important where the chips operate at relatively high clock speeds as, for example, at clock frequencies above about 100 MHz, more preferably above about 200 MHz and most preferably above about 300 MHz or more. In particular, certain chips are arranged to operate at clock speed of 500 MHz and, in some cases, above 800 MHz, with some of the most advanced chips having clock speeds above 1 GHz. The advantages of the present invention are more pronounced at such high clock speeds.

Figure 3:
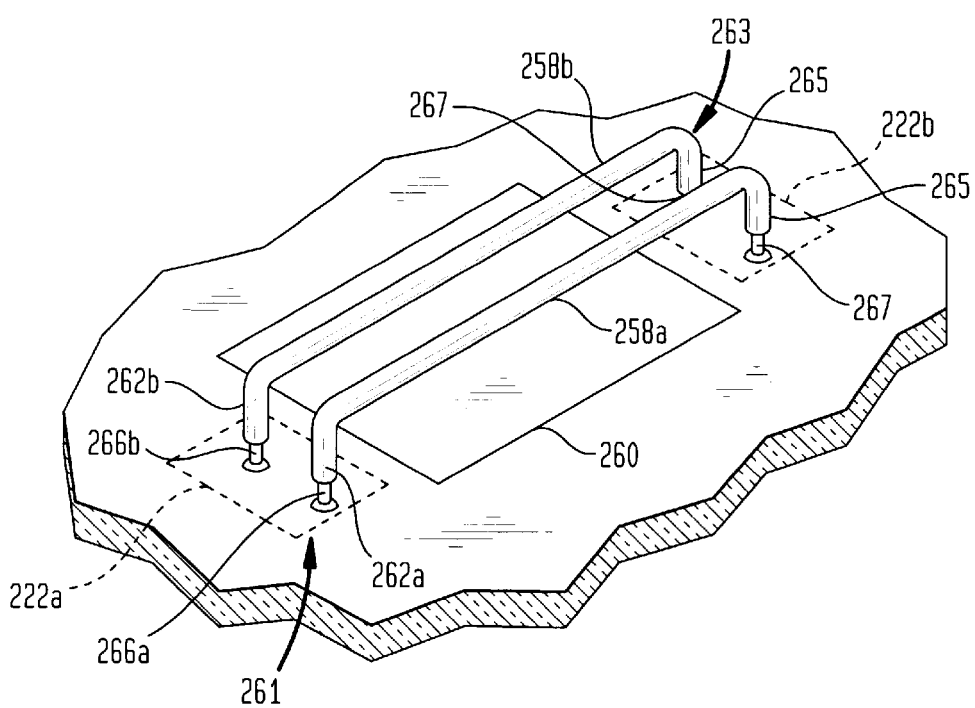
FIG. 3 is a fragmentary diagrammatic view depicting an assembly in accordance with another embodiment of the invention.

As illustrated in FIG. 3, traces within a dielectric element may be provided as pairs of traces such as traces 258a and 258b extending parallel to and adjacent one another. Traces 258a and 258b may overlie a common potential reference plane 260. Paired traces 258a and 258b are connected to a electronic elements 222a and 222b so that both traces of the pair interconnect the same electronic elements. The paired traces 258a and 258b provide a multiconductor transmission line. The transmission line has a first end 261 and a second end 263 disposed at spaced apart locations on the dielectric element. At each end, the conductive features or traces 258a and 258b constituting the transmission line are connected to an electronic element 222 of the chip through a set of deformable conductive elements or flexible leads extending between the traces and a set of closely spaced contacts on the chip. Thus, traces 258a and 258b are connected at end 261 through a pair of flexible leads 262a and 262b to a pair of adjacent contacts 266a and 266b on the front surface of the chip. Contact 266a and 266b in turn are connected to electronic element 222a. Similarly, at end 263 the traces are connected to contacts 267 through a further pair of flexible leads 265. Contacts 267 in turn are connected to internal electronic element 222b of the chip. The term "adjacent-connected end" as used in this disclosure refers to an end of a transmission line at which a plurality of conductive features incorporated in the transmission line are connected to a plurality of adjacent contacts on the chip. Preferably, the chip contacts of each such adjacent-connected end are within about 1000 mm center-to-center.

The electronic elements connected to the ends of the transmission line or paired traces are adapted to transmit signals between them through the paired traces. Thus, element 222a may be arranged to send signals to element 222b by applying a positive-going voltage on trace 258a and a negative-going voltage on trace 258b or vice versa. Alternatively, trace 258a may serve as a local ground whereas trace 258b may serve as the signal carrying trace. The receiving element 222b may be arranged to detect as the signal the difference between the voltages on traces 258a and 258b. This arrangement provides substantial reduction in electromagnetic noise and crosstalk from adjacent signal paths.

Figure 4:
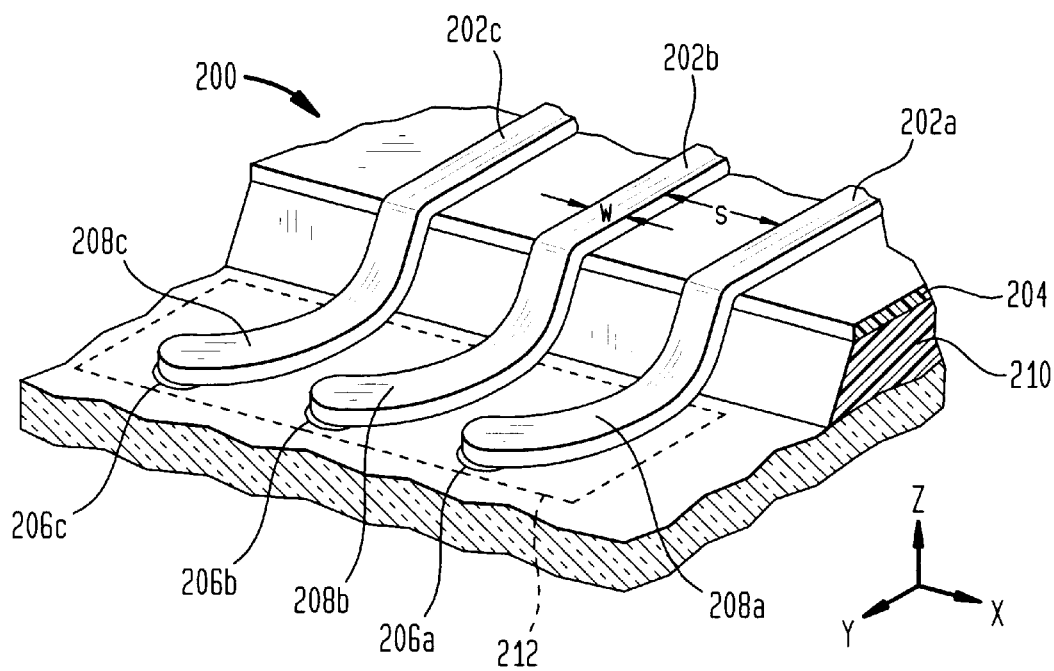
FIG. 4 is a fragmentary perspective view depicting an assembly in accordance with a further embodiment of the invention, with portions removed for clarity of illustration.

The structure depicted in FIG. 4 includes a transmission line 200 incorporating three parallel conductors 202a, 202b and 202c extending on a dielectric sheet 204. These particular conductors do not extend in proximity to any ground or other constant potential plane. At the end of the transmission line shown in FIG. 4, conductors 202a, 202b and 202c are connected to a set of three adjacent contacts 206a, 206b, 206c on the chip surface by a set of three independent flexible metallic leads 208a, 208b, 208c. The compliant layer 210, which closely surrounds leads 208 is partially removed in FIG. 4 for clarity of illustration. The center trace or conductive element 202b is connected through terminal 206b to a signal terminal 206b of an internal electronic element 212 within the chip, so that the center trace serves as the signal conductor, whereas the side traces 202a and 202c act as return paths. Thus, traces 202a is connected through lead 208a and terminal 206a to a local grand connection of electronic element 212 of the chip. The opposite external trace 202c is connected through a lead 208c and terminal 206c to a power or system supply voltage connection of the same electronic element 212. A similar connection (not shown) is provided at the other end of transmission line 200. A transmission line incorporating three adjacent conductors, one connected to a signal and the others connected to power and ground respectively is commonly referred to as a "tri-lead" transmission line. A tri-lead transmission line provides current return paths for signals of either polarity. For a signal of one polarity (rising voltage on the signal trace) the return current will flow along one of the outside traces, whereas for the opposite polarity signal (falling voltage on the signal trace) the return current will flow along the other exterior trace. The conductors of transmission line 200 typically are arranged to provide a characteristic impedance along the transmission line of about 20–160 Ohms, as for example, from about 20- to about 100 Ohms. The conductors constituting the traces typically have a width W of about 25 $\mu$m–50 $\mu$m, whereas the spaces between the conductors typically have a width S of about 25–75 $\mu$m and more typically about 50–75 $\mu$m. Here again, the traces when formed from copper, typically are more than about 5 microns thick.

The leads connecting the various traces 202 to the contacts at the end of the trace shown in FIG. 4 extend substantially parallel to one another. That is, each lead 208 extends downwardly from the dielectric film to the chip surface in the vertical or Z direction and curves in the horizontal or X and Y directions. The leads have a nested configuration, so that the convex side of each curving lead faces toward the concave side of the neighboring lead. The distance between the leads remains substantially constant over the entire lengths of the leads. Thus, the leads constitute an extension of the transmission line, without an abrupt change in characteristic impedance at the juncture between the leads and the traces. As mentioned above, the compliant material 210 closely surrounds the leads. To further minimize changes in characteristic impedance at the juncture of the leads and traces, the dielectric constant of the compliant material may be selected to match that of the flexible dielectric layer 204.

The layout of the conductors constituting transmission line 200 adjacent to one another minimizes the area encompassed by a loop including the signal conductor and any single return path, i.e., the loop including center conductor 202b and exterior conductor 202a, or the loop including center conductor 202b and exterior conductor 202c. This in turn minimizes the effect of electromagnetic interference on the signals sent through the transmission line. The effect of a changing magnetic field is directly related to the integral of the change in field over the area encompassed by the loop. The same layout also minimizes electromagnetic radiation from the transmission line. The flexible leads or deformable conductive elements 208 which connect the transmission line to the contacts on the chip form part of the loop. The use of physically parallel leads extending to closely spaced contacts on the chip further minimizes the area encompassed by each signal loop. The dual-conductor transmission line discussed above with reference to FIG. 3 provides similar effects. The leads associated with the dual-conductor line can be configured in an arrangement similar to that shown in FIG. 4.

Figure 5:
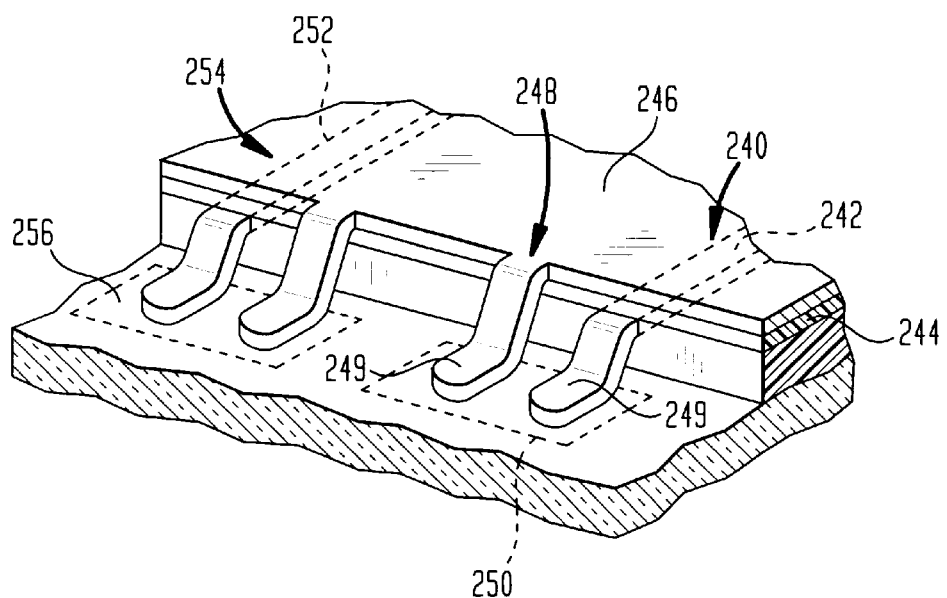
FIGS. 5 and 6 are views similar to FIG. 4 depicting assemblies according to other embodiments of the invention.

As shown in FIG. 5, a first multiconductor transmission line 240 includes a trace 242 extending on one side of a dielectric layer 244 and an electrically conductive potential plane element 246 on the opposite side of the dielectric layer, the trace and potential plane element cooperatively defining a multiconductor transmission line in the form of a stripline. The two conductive elements of this transmission line (the potential plane element and the trace) are connected by leads 249 at an end 248 of the transmission line to an electronic device 250 within the chip. The conductive elements of the transmission line are similarly connected to a further electronic element (not shown) of the chip at the other end of the transmission line. One or more additional transmission lines also incorporate the same conductive potential plane 246. Thus, conductor 252 and potential plane 246 cooperatively define a further transmission line 254, which is connected between an separate electronic element 256 of the chip at the end visible in FIG. 5 and another element (not shown) at the other end of line 254.

Figure 6:
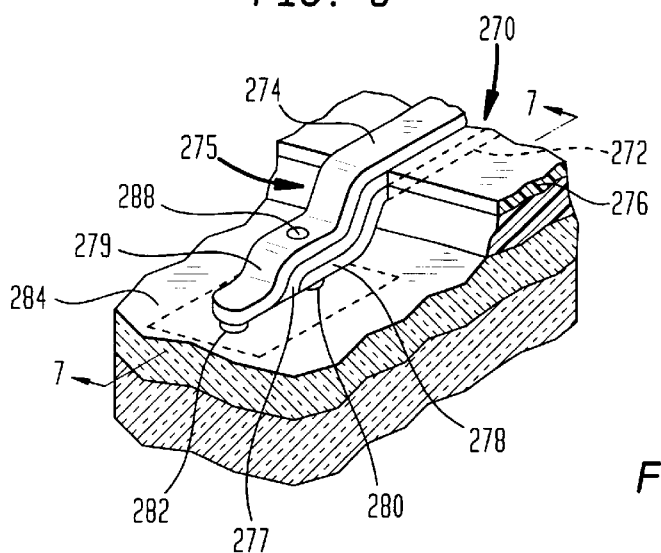
Figure 7:
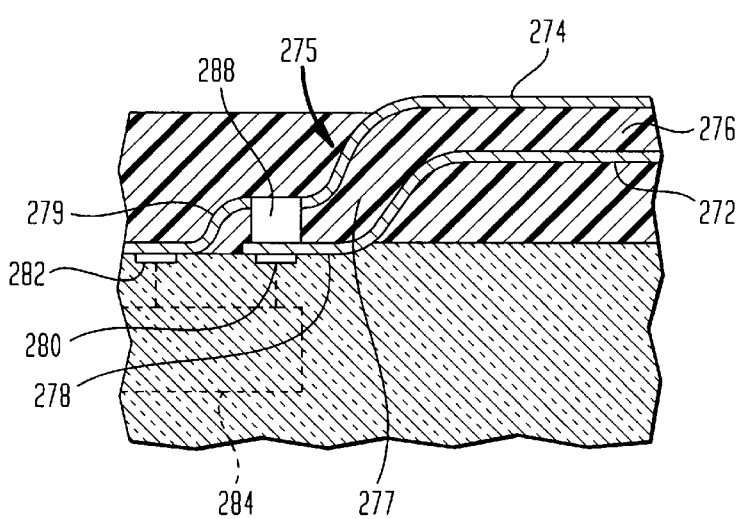
FIG. 7 is a fragmentary sectional view taken along line 7—7 in FIG. 6.

A further transmission line 270 is formed by a pair of traces 272 and 274 extending on opposite sides of a dielectric layer 276 (FIGS. 6 and 7). The conductive elements or traces 272 and 274 included in the transmission line are connected by a single plural-conductor lead 275. The lead includes a dielectric strip 277, which may be formed integrally with dielectric layer 276, a first conductor 278 continuous with trace 272 and a second conductor 279 continues with trace 274. In effect, the multiconductor lead is configured as an extension of the dielectric element, projecting from the main body of the dielectric element. The multiconductor lead is flexible so that the distal or tip end of the lead remote from the main body, is movable independently of the remainder of the dielectric element. At the distal end of the lead, the conductors of the multiconductor lead are attached to contacts 280 and 282, thereby connecting the conductive elements of the transmission line to an electronic element 284 of the chip. The bonds between the lead conductors and the contacts may be made by techniques such as thermal activation of a bonding material such as a solder, diffusion bonding alloy, eutectic bonding alloy or other fusible composition. The bond also can be made by techniques such as compression, thermocompression, sonic, thermosonic or ultrasonic bonding. Where the bonding technique requires access to the top surfaces of both conductors for direct engagement of a bonding tool with the conductor surface, a hole 288 may extend though the upper conductor 279 and dielectric strip 276 at or near the distal end of the lead, so that a bonding tool can be inserted in the hole to engage the upper surface of lower conductor 278. Various additional structures for multiconductor leads, and methods of making such bonds, are described in the aforementioned U.S. patent application Ser. No. 09/020,754, filed Feb. 9, 1998, the disclosure of which is incorporated by reference herein.

A similar connection can be provided at the opposite end (not shown) of the transmission line. The dimensions of the multiconductor lead may be selected to provide characteristic impedance identical or nearly identical to the characteristic impedance of the transmission line itself. Moreover, the conductors of the multiconductor lead are closely juxtaposed with one another, thereby minimizing the area within the signal loop. A multiconductor lead may include more than two conductors. For example, a multiconductor lead for use with a tri-lead transmission line may include three conductors. Also, the conductors of a multiconductor lead may extend alongside one another rather than on top of one another.

Figure 8:
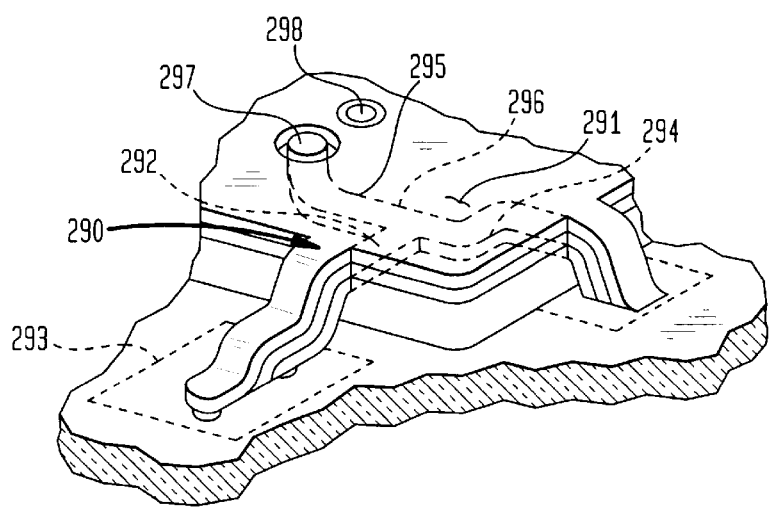
FIG. 8 is a view similar to FIG. 4 depicting an assembly according to yet another embodiment of the invention.

The transmission line 290 of FIG. 8 includes a conductor 292 and potential plane 291 defining a stripline as discussed above in connection with FIG. 5, the conductive elements of the stripline being connected to a first electronic element 293 of the chip through a multiconductor lead as discussed above with reference to FIGS. 6 and 7. Element 293 is arranged to send signals along the first transmission line or stripline 290. Transmission line 290 branches to form two further transmission lines 294 and 295. As further discussed below, the branching transmission lines have dimensions selected to provide an aggregate characteristic impedance in both branches equal to the characteristic impedance the main line 290. Line 294 extends to another element within the chip, whereas the signal conductor 296 of line 295 extends to a terminal 297 accessible at the top surface of the dielectric element (the surface facing away from the chip) so that terminal 297 is available for connection to an external signal path in the same manner as the terminals 64 discussed above with reference to FIG. 1. A further terminal 298 connected to potential plane 291 may be provided for connecting the potential plane so that the multiconductor signal path may continue in the external substrate to which the assembly is mounted.

The structures discussed above may include interconnections between essentially any electronic elements of the chip, as well as connections to external devices. However, it is particularly advantageous to use the conductive elements on the dielectric element to connect the internal data cache or "cache memory" of a microprocessor chip, or the data-receiving or data-sending interface of the cache memory, with the actual data processing units of the chip, such as the logic unit or an interface associated therewith. Such interconnection requires numerous parallel signal paths all capable of operating at the clock-speed of the chip to provide parallel transfer of, e.g., 16, 32, 64, 128 or 256 bits of data in each clock cycle. Moreover, the data cache and the logic unit may be separated from one another by a substantial distance on the chip and other components may be disposed between them.

Figure 9:
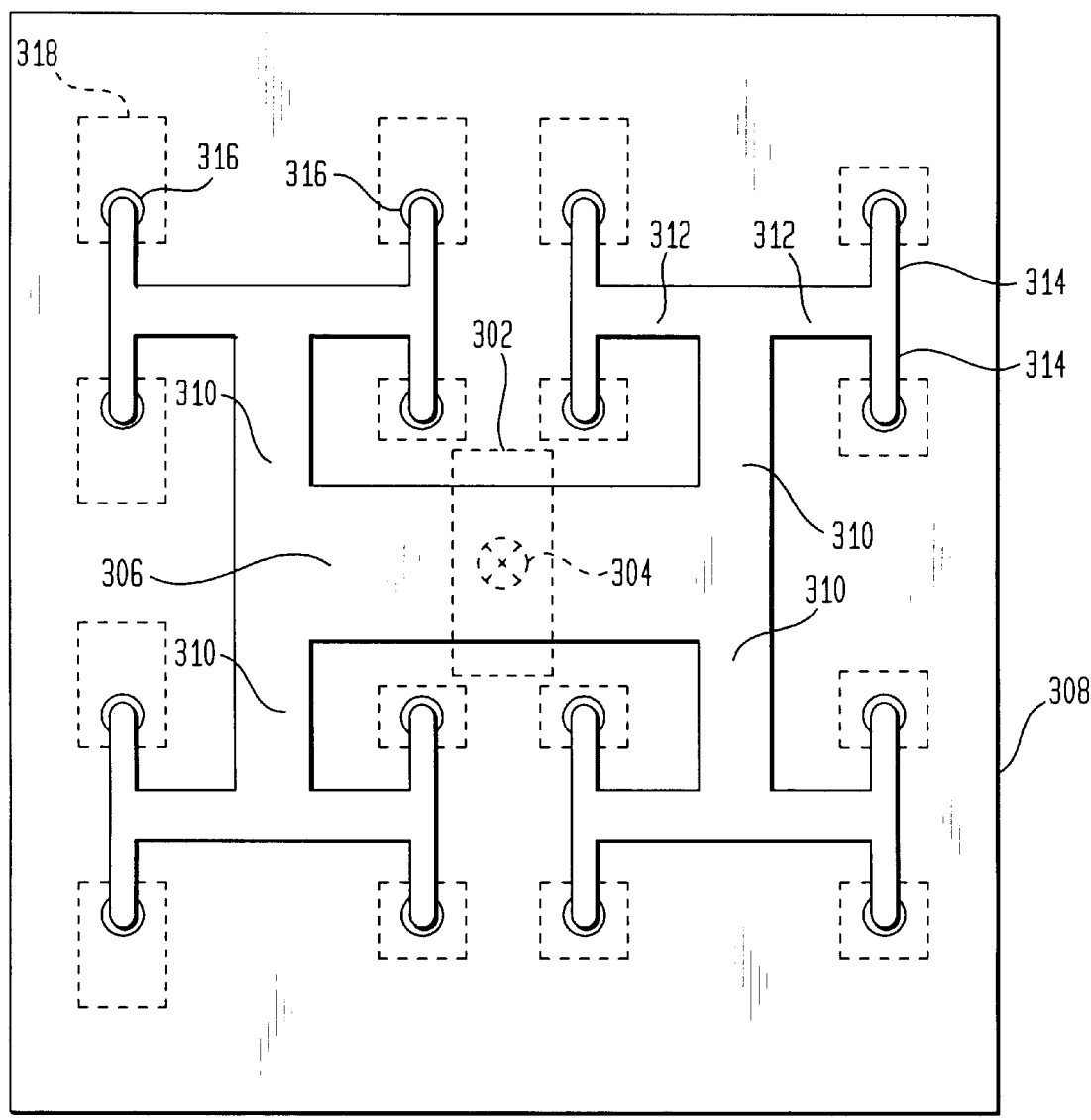
FIG. 9 is a diagrammatic plan view depicting an assembly in accordance with another embodiment of the invention.

A further particularly preferred embodiment of the present invention utilizes transmission lines on the dielectric element to distribute the timing signals from the internal clock of the chip to the clock-timed elements of the chip. Thus, as depicted in FIG. 9, the electronic elements of the chip may include an internal clock 302 connected to a contact 304 and adapted to send clock signals through that contact. Contact 304 in turn is connected to a primary or central conductive transmission line defined by trace 306 on the dielectric element 308 and a potential reference plane (not shown). The signal path defined by the central trace has a first characteristic impedance or $Z_0$. Each end of the central trace is connected to $n_2$ secondary traces 310. In the embodiment illustrated, $n_2$ is two at both ends of primary trace 306, and hence two secondary traces connect to each end of the primary trace. The characteristic impedance of each secondary trace is equal to $n_2$ times the characteristic impedance of the primary trace. Stated another way, the aggregate characteristic impedance of the secondary transmission lines connected at each end of the primary transmission line is equal to the characteristic impedance of the primary transmission line itself. This arrangement minimizes signal reflections at the end of the primary trace.

Similarly, $n_3$ tertiary transmission lines 312 are connected at each end of each secondary transmission line. The characteristic impedance of each tertiary line is $n_3$ times the characteristic impedance of each secondary line 310. Similarly, $n_4$ quaternary lines 314 are connected at each end of each tertiary trace and the characteristic impedance of each quaternary line is $n_4$ times the characteristic impedance of the connected tertiary line. The traces included in Quaternary lines 314 are connected typically through flexible leads and/or vias to contacts 316 of the chip. These contacts are connected to internal clock conductors or "clock drops" of the chip. Internal conductors may connect each contact 316 directly to a clock-timed element 318 or, alternatively, the internal conductors of the chip may further branch and may connect contact 316 to several clock-timed internal elements 318.

Thus, the transmission lines of the dielectric element form a branching structure such that at each end of a high-level line, the next lower20 level lines provide an aggregate impedance equal to the impedance of the high level line. This arrangement substantially suppresses reflections at the ends of the lines and thus substantially suppresses signal reflections in the traces used to carry the clock signals. The ability to provide controlled impedances in the transmission lines allows construction of such a substantially reflection-free signal path. A similar arrangement can be used for distribution of other signals from a single source or transmitter to numerous receivers. In examples of an arrangement where $n_2$, $n_3$, $n_4$ are each two, the characteristic impedances of the primary, secondary, tertiary and quaternary traces can be either 20, 40, 80 and 160 ohms, respectively, or 10,20,40 and 80 ohms, respectively. The arrangement can be varied so as to use fewer levels of transmission lines as, or example, to connect the tertiary lines directly to the clock drop or to use ore levels of traces. Also, $n_2$, $n_3$ and $n_4$ can have integer values other than 2. Also, the values of $n_2$, $n_3$ and $n_4$ need not be uniform throughout the branching structure; the number of lower-level lines connected at one end of a higher-level line may differ from the number of lower-level lines connected at the other end, but at each end the aggregate characteristic impedance of the lower-level lines (considered as parallel to one another) should be equal to the characteristic impedance of the higher-level line. Within a given layer, the characteristic impedances of transmission lines formed by traces overlying potential planes are approximately inversely proportional to the width of the trace. Thus, as depicted in FIG. 9, the primary trace is very wide, the secondary traces are narrower and so on. Further, it is possible and in some cases preferable to have multiple clock branching structure layers within the dielectric substrate. Individual clock branching structure layers can carry the same clock signals or different clock signals, with respect to the other clock branching structure layers, to respective electronic elements within the chip.

Figure 10:
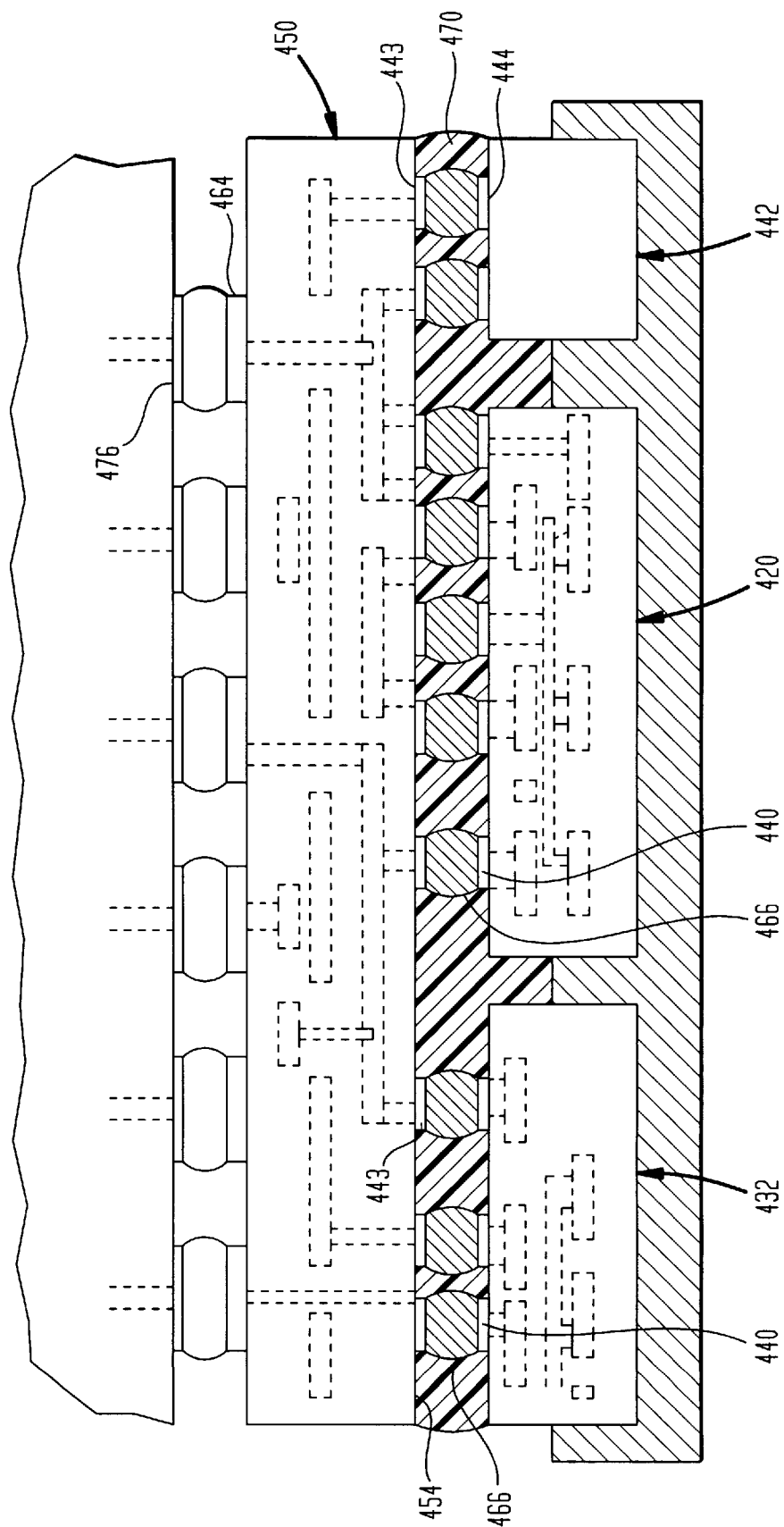
FIG. 10 is a view similar to FIG. 1 but depicting an assembly in accordance with a further embodiment of the invention.

An assembly according to a further embodiment of the invention (FIG. 10) includes masses of a fusible, electrically conductive material 466 connected between the terminals 440 of chips 420 and 432 and the conductive contacts 443 on the bottom surface 454 of dielectric element 450. Additional masses 440 of fusible conductive material extend between terminals 444 of an additional electrical element such as a capacitor and further contacts 443 on the dielectric element. A layer of a compliant dielectric material 470 such as a gel, elastomer or foam extends between the dielectric element 450 and the chips and additional electrical element. The compliant dielectric material intimately surrounds each mass of fusible conductive material such as a relatively low-melting metal or metal alloy. The fusible conductive material has a melting temperature which preferably is within or below the range of operating temperatures of chips 420 and 432. Desirably, the melting temperature is less than about 150° C., preferably less than about 125° C. and more preferably less than about 100° C. Melting temperatures below about 85° C. are more preferred, and melting temperatures below about 65° C. are even more preferred. The range of melting temperatures between about 25° C. and 65° C. is particularly preferred, and melting temperatures between about 35° C. and about 55° C. are especially preferred.

During operation of the assembly, the fusible masses reach melting temperature and become wholly or partially liquid. The molten fusible material in each mass is confined by the surrounding compliant dielectric material 470. In this condition, the molten fusible material continues to maintain electrical conduction between the terminals of the chips and the conductive contacts of the dielectric element. However, the molten fusible material offers essentially no resistance to deformation. The fusible material thus serves as deformable electrically conductive element, in place of the flexible leads discussed above. Moreover, the fusible material masses provide contacts which have low resistance and which also have low self-inductance, and therefore have low impedance even at high frequencies. To minimize the inductance of the masses, they are preferably formed as solid, generally spherical or cylindrical bodies.

Microelectronic assemblies and devices utilizing fusible conductive materials, as well as methods of making such assemblies, are described in greater detail in the aforementioned U.S. patent application 08/641,698 and the corresponding International Patent Publication WO 97/40958 the disclosures of which are incorporated by reference herein. As further set forth in the '958 Publication, the contacts of the chip and dielectric element may be provided with barrier layers which are resistant to alloying with the molten fusible material. The masses of fusible material may be applied to one of the elements to be interconnected, such as to the chip or to the dielectric element, using techniques similar to those used to apply conventional solder masses. The elements may then be juxtaposed with one another and heated to reflow the fusible material onto the contacts. A curable liquid material may then be introduced around the fusible material and cured to form the compliant material.

As also set forth in the '958 Publication, the fusible material may be adapted to melt during processing steps. For example, where the contacts 464 of dielectric element 450 are connected to pads 476 on a substrate, fusible masses 466 may be arranged to melt during the bonding process. This allows movement of the dielectric element 450 during bonding, so as to compensate for any deviation of contacts 464 or pads 476 from planarity. This capability is particularly useful where dielectric element 450 is a flexible, sheetlike element such as a flexible polyimide structure.

As discussed above with reference to terminals 64 (FIG. 1); 297 and 298 (FIG. 8) and 464 (FIG. 10) terminals may be provided to connect the assembly to external circuitry. The aforementioned Patents, PCT publications and patent applications disclose numerous arrangements and patterns of leads and traces which connect contacts on the chip to terminals on a dielectric element. Any of these patterns can be incorporated in an assembly according to the teachings of the present invention. For example the leads and traces associated with the terminals can "fan-in" or extend inwardly from contacts at the periphery of the chip to terminals overlying the central region of the chip. Also, the traces associated with terminals can "fan-out" or extend outwardly beyond the periphery of the chip. A "fan-in-fan-out" structure which has some leads and traces extending inwardly to terminals on a central region of the structure and also has other leads and traces extending outwardly to terminals on a peripheral region of the structure. Any of these structures can be made in accordance with the present invention.

Figure 11:
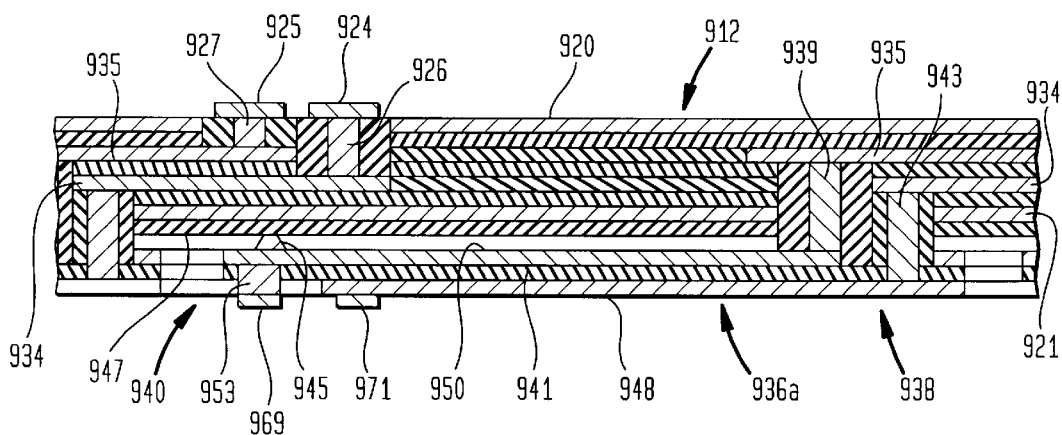
FIG. 11 is a fragmentary sectional view depicting a component in accordance with a further embodiment of the invention.

A component in accordance with a further embodiment of the invention (FIG. 11) includes a multilayer dielectric support structure. The support structure includes potential plane elements 920 and 921 adjacent the top and bottom of the structure, and further includes internal traces 934 and 935 disposed at various layers within the substrate. Although only two potential plane elements and two layers of traces are illustrated in FIG. 11, it should be appreciated that, in practice, the structure may include numerous layers of traces and more or fewer potential plane elements. Typically, the traces within each layer extend generally parallel to one another. Pairs or triplets of traces in a single layer may define dual-lead or tri-lead transmission lines as discussed above with reference to FIGS. 3 and 4, whereas traces in superposed layers may define transmission lines as shown in FIGS. 6 and 7, and a trace and a potential plane may define stripline transmission lines as shown in FIG. 4. A transmission line may also include plural traces and one or more potential planes. In the structure of FIG. 11, the two layers of traces 934 and 935 depicted in the drawing have traces extending in the same direction. Other layers (not shown) have traces extending in perpendicular directions, into and out of the plane of the drawing as seen in FIG. 11. The connection component has numerous plural conductor leads 936 distributed in an "area array" pattern on the bottom surface of the support structure so that the pattern of leads covers a substantial area on the bottom of the structure. Each plural conductor lead includes a flexible dielectric, preferably polymeric dielectric strip 941, a first conductor 950 overlying the top surface of the polymeric strip and a second conductor 948 overlying the opposite, bottom surface of the strip, i.e., the surface of the strip facing away from support structure 912.

A first or fixed end 938 of each lead 936 is permanently attached to the support structure 912. A first metallic vertical conductor or via 939 connects the first conductor 950 of lead 936a to a trace 935 in one layer, whereas a second vertical conductor 943 at the first end 938 of the lead connects the conductor 948 with a further trace 934 within the support structure. The vertical conductors are electrically isolated from one another and from other conductive structures on the support structure as, for example, from the potential plane element 921 on the bottom surface. Also, the second via 943 extends through the polymeric strip 941 of the lead. Again, the particular set of traces depicted in FIG. 11 is merely representative of the numerous traces included in a multilayer structure. Thus, the vias at the fixed ends of the leads 936 may be connected to traces in different layers; to different traces in the same layer or to traces and potential planes. Preferably, however, the two vias associated with each lead are connected to conductive features, such as traces 934 and 935, which cooperatively define a transmission line with a controlled, characteristic impedance along its length. Some leads may have one or both of the vias associated with the lead connected to other conductive elements on the support structure as, for example, to terminals on the top surface of the support structure. Also, the vias 939 and 943 associated with each plural-conductor lead need not be side-by-side as illustrated. For example, the vias associated with each double connection lead may include a hollow via, and a further via inside the hollow via.

The second or tip end 940 of each double connection lead 936 is releasably connected to the bottom surface of the support structure. The releasable connection is arranged so that it is strong enough to hold the tip end of the lead in place from the time the component is manufactured until the component is used, but is weak enough that the connection can be readily broken by pulling the lead away from the bottom surface of the support structure. In the particular arrangement shown in FIG. 11, the first trace 950 is provided with a small metallic "button" 945 adjacent its tip end. This button weakly adheres to a dielectric layer 947 on the bottom surface of the support structure. As described in greater detail in the aforementioned '964 patent, metallic "buttons" of this nature can be formed by an etching process in which a relatively readily etchable metal such as copper is attached by an etchant which does not substantially attack the metal of the lead. Other structures which releasably secure the tip ends of the leads to the support structure may be employed. For example, metallic button 945 may be replaced by a polymeric connector of small cross-sectional area, such as a polymeric connector having widthwise dimensions smaller than the width of the lead. Such a polymeric connector may be readily broken by pulling the lead tip end away from the bottom surface of the support structure. As described in further detail in the co-pending, commonly assigned U.S. patent application of Belgacem Haba entitled "Components With Releasable Leads", Ser. No. 020,750, Filed Feb. 9, 1998, the disclosure of which is hereby incorporated by reference herein, polymeric connecting elements of this nature can be formed by etching a polymer layer as, for example, by plasma etching in an oxygen-containing plasma.

At the tip end of each plural conductor lead, an electrically conductive, preferably metallic via liner 953 projects downwardly from the first conductor 950 through the polymeric dielectric strip 941. A mass 969 of an electrically conductive bonding material, which preferably is a heated-activatable bonding material as discussed above is provided on the bottom end of via 953. A mass 971 of a similar bonding material is provided at the distal end of the second conductor 948. The distal end of the second conductor terminates proximally of via 953 and mass 969, so that the tip end of the second conductor 948 remains electrically insulated from the first conductor 950 and via 953.

The component also has terminals 924 and 925 on the top surface of support structure 912. These terminals may be connected to some of the internal traces 934 and 935, as by vertical conductors or vias 926 and 927, respectively. The terminals preferably are provided in sets such as pairs or triplets, with the terminals of each set being connected to a set of electrically conductive features such as co-directionally extending traces, or a trace and potential plane, which cooperatively define a transmission line. Other terminals 924 and 925 may be connected to other electrically conductive features such as directly to the vias 943 and 939 associated with the leads, or to isolated potential plane elements or isolated traces.

Figure 12:
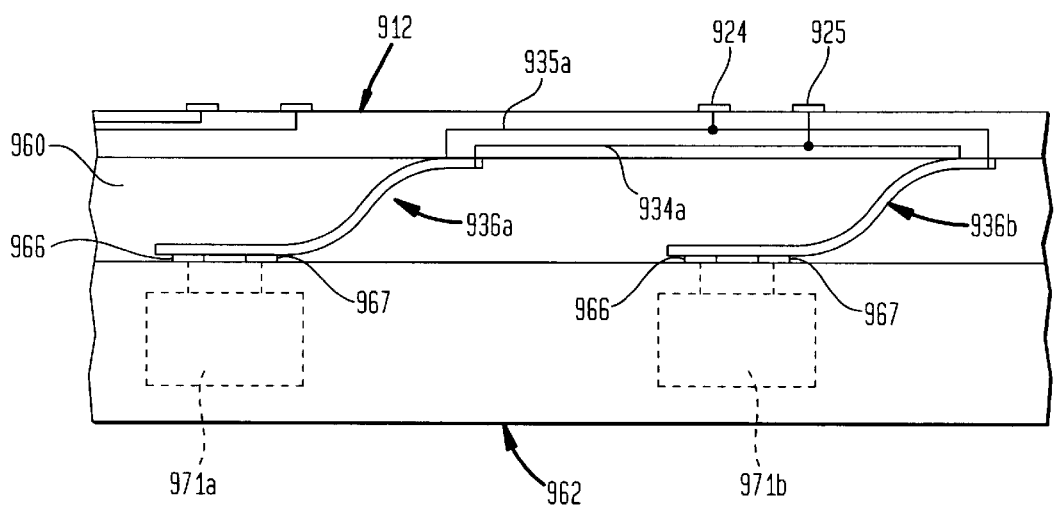
FIG. 12 is a fragmentary elevational view depicting an assembly incorporating the component of FIG. 11.

The component of FIG. 11 may be connected to a microelectronic element such as a semiconductor chip 962, as depicted in FIG. 12. In the connection process, the bottom surface of the connection component, with leads 936 thereon is juxtaposed with the top surface of the chip so that bonding material masses 969 and 971 on the tip ends of each lead are aligned with contacts 966 and 967 on the microelectronic element The support structure and microelectronic element are engaged with one another under heat and pressure so that the bonding material masses 969 and 971 at the tip ends of the lead are activated to bond the via 953 (FIG. 11) associated with the first conductor 950 of each lead to a terminal 966 on the microelectronic element and to bond the second conductor 948 to another contact 967 of the same contact pair on the microelectronic element. The support structure and microelectronic element are moved away from another to deform the leads through a preselected displacement and to detach the tip end of each lead from the support structure and to deform the leads into the vertically extensive configuration depicted in FIG. 12. A compliant, dielectric encapsulant 960 is injected and cured between the support structure and the microelectronic element.

The resulting structure incorporates leads and traces in support structure 912 which interconnect two or more electronic devices 971 within the same microelectronic element or chip. The individual devices connected to one another by the interconnected traces and leads may be connected in a differential signal or tri-lead arrangement of the types described above. Here again, sets of closely spaced contacts may be associated with each device, and these pairs may be interconnected to one another by parallel conductive paths. For example, devices 971a and 971b are connected to one another by a multiconductor-transmission line constituted by the conductors of leads 936a and 936b and by traces 934a and 935a within the support structure. The transmission line extending between the devices has well controlled impedance over substantially all of its length and provides rapid, predictable signal transmission. The connected devices may also be connected to the terminals 924 and 925 on the top surface of the dielectric support structure as schematically depicted in FIG. 12.

Figure 13:
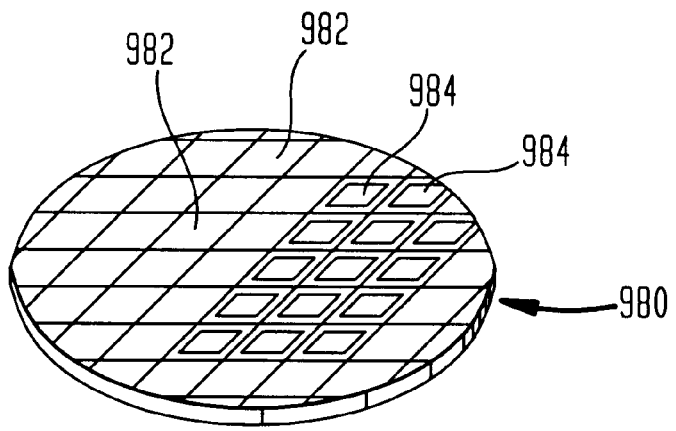
FIGS. 13 and 14 are diagrammatic perspective views depicting steps in processes according to further embodiments of the invention.
Figure 14:
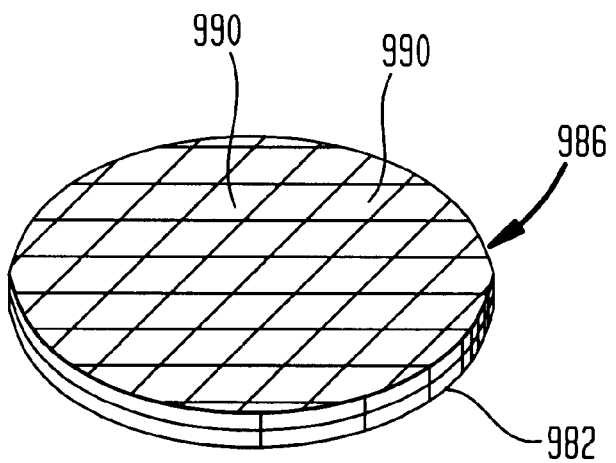

The process of applying the dielectric layer and deformable conductive elements can be conducted using an individual chip, or else can be conducted while the semiconductor chip is part of a unitary semiconductor structure such as a wafer. For example, a unitary wafer 980 (FIG. 13) includes a plurality of individual semiconductor chips 982. A set of individual dielectric elements 984 with conductive features thereon can be connected to the various chips in the manner described above and connected to the chips. After such connection, and preferably after introduction of a compliant material between the chips and dielectric elements, the wafer is severed so as to provide individual units as depicted in FIG. 2. Alternatively, the dielectric elements 990 may be provided as parts of a unitary dielectric structure 986 (FIG. 14). This unitary structure is assembled to the wafer and the contacts on the chips in the wafer are connected to the conductive features of the unitary structure through the deformable conductive elements. Preferably, a compliant layer is introduced between the unitary structure and the wafer. The assembly is then severed so as to sever both the unitary structure and the wafer and provide individual units each including a chip and an dielectric element.

Deformable conductive elements other than the specific types mentioned above can also be employed. For example, flexible electrically conductive polymers or polymer compositions may be utilized. As used in this disclosure, the term "deformable conductive element" should be understood as referring to a conductive element which is either fluid or else substantially more flexible than the parts to which it is connected, so that the conductive element tends to deform to a greater degree than the parts of the structure physically connected to the conductive element when the structure is deformed. Also, a deformable conductive element which is flexible should be considerably more flexible than a typical solder ball. The preferred flexible conductive elements are elongated leads, having a long dimension several times that of their shortest dimension, so that the elongated leads can deform in bending with bending strain distributed over a substantial portion of the length of the lead. Moreover, a deformable conductive element as referred to herein should not undergo plastic deformation or stressed beyond its fatigue limit stress when subjected to thermal cycling of the assembly over typical operating and storage temperatures as, for example, −40° C. to 85° C. The term "fatigue limit stress" as referred to herein means the stress which the material will fail in fatigue at an 10,000 cycles. Where elements vary substantially in physical properties with temperature (such as certain fusible conductive elements discussed above), the determination of whether a conductive element is or is not deformable should be made on the basis of its properties at the maximum normal operating temperature of the chip. Typical silicon-based semiconductor elements are designed to operate at about 40° C. to about 85° C.

As these and other variations and combinations of the features discussed above can be utilized without departing from the present invention, the foregoing description of the preferred embodiments should be taken by way of illustration rather than by way of limitation of the invention as defined by the claims.

What is claimed is:

1. A microelectronic assembly including:
    (a) a first semiconductor chip including a plurality of electronic elements and a front surface having contacts thereon, at least some of said electronic elements being connected to said contacts;
    (b) a dielectric element separate from said chip and movable with respect to said chip, said dielectric element having a plurality of conductive interconnect traces thereon; and
    (c) deformable conductive elements interconnecting said at least some of said contacts with said interconnect traces so that at least some of said electronic elements are connected to one another for transmission of signals therebetween through said traces.

2. An assembly as claimed in claim 1 wherein said dielectric element and said first semiconductor chip have different coefficients of thermal expansion.

3. An assembly as claimed in claim 2 wherein said chip is formed predominantly from silicon and said dielectric element has a coefficient of thermal expansion greater than $10 \times 10^6$ cm/cm/° C.

4. An assembly as claimed in claim 2 wherein said dielectric element includes a polymeric body having said traces thereon and wherein said traces are metallic.

5. An assembly as claimed in claim 1 wherein said deformable conductive elements include flexible leads.

6. An assembly as claimed in claim 1 wherein said deformable conductive elements include masses of a fusible electrically conductive material having a melting temperature below about 150° C.

7. An assembly as claimed in claim 6 wherein said chip is adapted to operate in a range of operating temperatures up to a maximum operating temperature and said melting temperature is at or below said maximum operating temperature.

8. An assembly as claimed in claim 6 further comprising a compliant dielectric material surrounding said masses and confining said fusible material when said fusible material is in a molten state.

9. An assembly as claimed in claim 1 further comprising a compliant dielectric layer disposed between said dielectric element and said chip.

10. An assembly as claimed in claim 9, wherein said dielectric element overlies said front surface of said first semiconductor chip, said compliant layer being disposed between said front surface of said chip and said dielectric element.

11. An assembly as claimed in claim 1 or claim 10 wherein said dielectric element has a bottom surface facing toward said first chip, a top surface facing away from said first chip, and a plurality of terminals accessible at said top surface, said terminals being connected to said chip by said deformable conductive elements.

12. An assembly as claimed in claim 11 further comprising a substrate having electrically conductive elements therein, said terminals on said dielectric element being electrically connected to the conductive elements of said substrate.

13. An assembly as claimed claim 1 further comprising a second semiconductor chip having electronic elements therein juxtaposed with said dielectric element, the electronic elements of said second chip being connected to at least some of said traces.

14. An assembly as claimed in claim 13 wherein some of said traces and said interconnect electronic elements of said first and second chips with one another.

15. An assembly as claimed in claim 1 or claim 10 further comprising an auxiliary circuit element juxtaposed with said dielectric element and connected to at least some of said traces, at least some of said traces connecting electronic elements of said first chip to said auxiliary circuit element.

16. An assembly as claimed in or claim 1 or claim 10 wherein said traces have resistivity less than 2.5 microohms-cm.

17. An assembly as claimed in claim 16 wherein said traces include one or more metals selected from the group consisting of gold, silver, copper and alloys thereof.

18. An assembly as claimed in claim 17 wherein said traces include copper.

19. An assembly as claimed in claim 16 wherein said traces are at least about 10 $\mu$m wide and at least about 5 $\mu$m thick.

20. An assembly as claimed in claim 16 wherein said dielectric element includes a dielectric material having dielectric constant of less than about 4.

21. An assembly as claimed in claim 20 wherein said dielectric material consists essentially of polyimide.

22. A method of making a semiconductor device comprising the steps of:
    (a) providing a unitary semiconductor structure having a front surface, said semiconductor structure incorporating a plurality of electronic elements within said structure and contacts on said front surface, said electronic elements having signal connections, at least some of said signal connections being connected to said contacts;
    (b) assembling a dielectric structure having a electrically conductive features thereon to said semiconductor structure so as to connect the electrically conductive features with said contacts through deformable conductive elements so that at least some signal connections of said electronic elements within said unitary semiconductor structure are connected to one another through said contacts, said deformable conductive elements and said conductive features on said dielectric structure, and so that said dielectric structure remains movable with respect to said semiconductor structure.

23. A method as claimed in claim 22 wherein said unitary semiconductor structure includes a plurality of chips, said assembling step being performed so that electronic elements within each said chip are connected to one another through conductive features within a portion of the dielectric struc ture associated with that chip, the method further comprising the step of severing said unitary semiconductor structure to separate each said chip from the unitary semiconductor structure so that the portion of the dielectric structure associated with such chip remains with the chip.

24. A method as claimed in claim 23 wherein said dielectric structure is a unitary dielectric structure incorporating a plurality of said portions, said severing step being performed so as to sever said dielectric structure.

25. A method as claimed in claim 23 wherein said dielectric structure includes a plurality of separate components, said assembling step being performed so that one said component is assembled to each said chip.

26. A method as claimed in claim 22 wherein said deformable conductive elements include flexible leads, said assembling step including the step of deforming said flexible leads through a predetermined displacement.

27. A method as claimed in claim 22 further comprising the step of providing a compliant material between said dielectric element and said chip.

* * * * *

UNITED STATES PATENT AND TRADEMARK OFFICE
CERTIFICATE OF CORRECTION

PATENT NO.    : 6,365,975 B1
DATED         : April 2, 2002
INVENTOR(S)   : Thomas H. DiStefano and John W. Smith It is certified that error appears in the above-identified patent and that said Letters Patent is hereby corrected as shown below:

<u>Column 2,</u>
Line 18, "as a 'interposer'" should read -- as an "interposer" --.

<u>Column 3,</u>
Line 16, "may incorporated" should read -- may be incorporated --.

<u>Column 4,</u>
Line 44, "At least" should read -- At at least --.
Line 48, "adjacent connected" should read -- "adjacent-connected" --.
Line 63, "leads at least" should read -- leads at at least --.

<u>Column 8,</u>
Line 28, "expansion is of" should read -- expansion of --.

<u>Column 9,</u>
Line 34, "co30 pending" should read -- co-pending --.

<u>Column 12,</u>
Line 28, "Contact 266a" should read -- Contacts 266a --.

<u>Column 16,</u>
Line 11, "lower20 level" should read -- lower-level --.

<u>Column 22,</u>
Line 10, "as claimed claim" should read -- as claimed in claim --.
Line 16, "traces and said interconnect" should read -- traces interconnect --.

UNITED STATES PATENT AND TRADEMARK OFFICE
CERTIFICATE OF CORRECTION

PATENT NO. : 6,365,975 B1
DATED : April 2, 2002
INVENTOR(S) : Thomas H. DiStefano and John W. Smith It is certified that error appears in the above-identified patent and that said Letters Patent is hereby corrected as shown below:

Column 22 cont'd,
Line 48, "having a electrically" should read -- having electrically --.
Line 63, "dielectric struc" should read -- dielectric struc- --.

Signed and Sealed this

Twentieth Day of May, 2003

JAMES E. ROGAN
*Director of the United States Patent and Trademark Office*